United States Patent [19]

Weinold

[11] Patent Number: 5,010,445

[45] Date of Patent: Apr. 23, 1991

[54] DIP SWITCH WITH BUILT-IN ACTIVE INTERFACING CIRCUITRY

[76] Inventor: Christoffer S. Weinold, 1307 Ridge Rd., Vista, Calif. 92083

[21] Appl. No.: 470,089

[22] Filed: Jan. 25, 1990

[51] Int. Cl.[5] .......... H05K 7/00

[52] U.S. Cl. .......... 361/392; 361/396; 361/400; 361/405

[58] Field of Search .......... 200/16 R, 16 F, 292; 361/380, 392-396, 400, 405

[56] References Cited

U.S. PATENT DOCUMENTS

| | | | |
|---|---|---|---|
| Re. 31,929 | 6/1985 | Donaher et al. | 361/393 |
| 4,376,234 | 3/1983 | Liataud | 200/16 R |
| 4,398,235 | 8/1983 | Lutz et al. | 361/393 |
| 4,454,391 | 6/1984 | Olsson | 200/16 D |
| 4,598,307 | 7/1986 | Wakabayashi et al. | 357/75 |
| 4,642,734 | 2/1987 | Anderson | 361/380 |
| 4,658,101 | 4/1987 | Akimoto et al. | 200/16 R |
| 4,779,164 | 10/1988 | Menzies, Jr. et al. | 361/393 |
| 4,788,393 | 11/1988 | Muramatsu et al. | 200/292 |
| 4,811,167 | 3/1989 | Rippey et al. | 361/392 |

*Primary Examiner*—Gregory N. Thompson

*Attorney, Agent, or Firm*—D. Pressman

[57] ABSTRACT

A DIP or surface mount type switch (10) contains a built-in electronic system for direct interfacing to an electronic circuit. The DIP switch and the built-in electronic system consisting of bias resistors (22), active buffers (14), and decoding circuitry (18), are combined as a single package. These components will be mounted and interconnected to a substrate PCB (26), or chip carrier package (31), or as an integral unit within the switch housing (12). This DIP switch also includes socket pins or mounting leads (30) to connect the assembly to a system circuit board.

18 Claims, 10 Drawing Sheets

DIP SWITCH WITH BUILT-IN ACTIVE INTERFACING CIRCUITRY

BACKGROUND

1. Field of Invention

This invention relates to switches for use with electronic equipment, particularly to such switches and associated electronic circuitry which interfaces with, reads, and interprets the switches' settings.

2. Description Of Prior Art

Electronic engineers commonly provide DIP (Dual-Inline Package) switches for use in electronic circuits to provide a way to select various system configuration choices. DIP switches are small rectangular electronic components, usually packaged in a plastic housing having typical dimensions, in millimeters, of 6.8 to 50.8 long, 3.68 to 15.24 wide, and 2.54 to 12.7 high. The housing contains the electrical and mechanical components of the switch and a means to connect and solder the package to a mounting surface, described later. Although the acronym "DIP" is commonly used to refer to dual-inline packages, it has also been used to refer to any packaged electronic device that can plug into or be soldered to a circuit board.

There are many different kinds of DIP switches These include SPST (single-pole, single-throw), MPST (multiple-pole, single-throw), MTSP (multiple-throw, single-pole), rotary contacting, and variations of all these. A DIP switch housing can contain one or more individual switches of the above types.

The SPST DIP switch, a very common type, contains one or more SPST switches in a single package. A SPST switch consists of a single set of electrical contacts which can only move and operate in a single on or off manner When in the on position, the SPST switch is considered "closed", "transmissive" or "conductive" and provides an electrical path between a single pair of contacts. When in an off position, the electrical connection is considered "open", "non-transmissive" or "non-conductive" and thus provides essentially an infinite resistance between the contacts. Each switch has an on and off setting which is independent of the other switches in the DIP package. The package also contains a plurality of thin metal leads projecting therefrom. These leads provide a electrical path from the switch contacts to external components in an electrical system, as described later.

Other types of DIP switches have different arrangements of switch contacts which can cause the switch to operate several contacts or poles with a single throw or to allow multiple positioning of a single pole. Rotary contacting DIP switches are yet another type which use multiple electrical switch contacts to provide a selection of switching combinations in a single package.

DIP switches are used in a wide variety of applications, particularly in applications having to do with computers or microprocessor-based equipment and systems. A microprocessor is a computer built into a integrated circuit. Some examples include computer I/O (input/output) circuits, memory and video boards, communication terminals, computer printers, garage-door openers, wireless telephones, and a large number of other products DIP switches are frequently used in computer systems to assign an address on the computer system's bus to an I/O, memory, or other option board. Address assignment refers to a function which occurs in most computer and microprocessor systems which allows the CPU (central processing unit) to select a device within the computer system with which it will transfer and receive data.

DIP switches are also used to select a security code in garage-door openers, wireless telephones, and similar devices. The DIP switch provides a simple way for a user to change a value or select a number associated with the operation of that product. These products are typically based on a microprocessor and presently require several additional components, as described below, to read the DIP switches' setting and adjust its operation accordingly.

Communications terminals are the hardware and cabling system associated with a data transmission system used with computers and other devices as a means of allowing data transfers to and from other computers, peripheral devices, and other products. Typical terminals which use DIP switches include computer printers, terminals, and monitors.

These are but a few of the more common applications of DIP switches. There are many other applications and products which use DIP switches, but these are far too numerous to list here These applications can offer a range of data transfer options. It is highly desirable to be able to easily change the configuration or protocol of the communications signals recognized by these products. A DIP switch is frequently used to allow a user to select these various configuration options. However in order to read the DIP switches' setting, these systems must presently include several additional components to interface to the DIP switch and which add to the size, cost, and complexity of the product.

These additional and external components are required in order for the DIP switch to be used by most microprocessors, computers, or electronic circuits. Specifically, in order for the DIP switch to be read and interpreted by any system or circuit, it must have a series of pull-up or pull-down resistors, a tri-statable interface buffer, decode logic circuitry, and other devices that are in addition to and are external to the DIP switch, as described later.

These extra components usually take up at least as much room on the system circuit board as the DIP switch package itself, and can take considerable time and expense to install, assemble, and test in the electronic system where they are used. Circuit board space and the number of components in an electronic system have a direct effect on the cost of raw materials and labor to manufacture that system. Circuit design and manufacturing engineers go to extreme lengths to reduce these by whatever means are available. It would be a great advantage if it were not necessary to connect such additional devices to a DIP switch in order to use the DIP switch in an electronic system.

Several DIP switch patents, such as U.S. Pat. No. 4,376,234, entitled "DIP Switch", granted Mar. 8, 1983, to James P. Liataud, and U.S. Pat. No. 4,658,101, entitled "Sliding Type DIP Switch" granted Apr. 14, 1987 to Takashi Akimoto, Akio Kai, Massao Kobayashi, and Haruo Itoh, describe mechanical or basic electrical features of a on/off multi-pole (multiple connection) contacting switch. Others, such as U.S. Pat. No. 4,454,391 entitled "Low Profile DIP Switch" granted June 12, 1984 to Billy E. Olsson, describe a unique profile or package design. U.S. Pat. No. 4,642,734, entitled "Integrated Circuit Chip DIP Switch", granted Feb. 10, 1987 to James R. Anderson, describes an interlocking and disconnectable system for mounting a DIP switch on a disconnectable handle. U.S. Pat. No. 4,788,393, entitled "DIP Rotary Code Switch", granted Nov. 29, 1988 to Masayuki Muramatsu and Atsuo Yamazaki, describes a rotary contacting, encoded DIP switch. Rotary coded DIP switches are frequently available in decimal, binary, or hexadecimal number formats and output codes.

In all of the above DIP switches, none include the required active electronic components for using the DIP switch as part of the DIP switch assembly. Therefore these extra components must be connected externally to the DIP switch. These take up valuable circuit board space and require many interconnections on the system's circuit board. They also require extra assembly time to install and test on such circuit board. Overall product sizing and cost of a system using a DIP switch are directly and substantially increased by these factors.

I believe that DIP switch designers and manufacturers have not provided an improved design because they are mechanically oriented and are mostly concerned with the mechanical operation and packaging of the DIP switch. Similarly electronic engineers do not generally have a background or interest in pursuing mechanical solutions to their engineering problems.

OBJECTS AND ADVANTAGES

It is accordingly, an object and advantage of this invention to provide a DIP switch which requires no additional external components to perform various functions.

Other objects are to provide a DIP switch which includes active electronic component while only slightly changing the package size and shape of the DIP switch, to reduce the time necessary to assemble and test a system using a DIP switch due to a reduction in components and interconnections on the circuit board using the DIP switch, to allow a smaller package design of a system using a DIP switch due to the reduction of circuit board size, and to reduce the time and costs associated with designing a DIP switch in an electronic system by way of a reduction of components needed to use the switch.

Further objects and advantages will become apparent from a consideration of the drawings and ensuing description.

SUMMARY

The foregoing objects are accomplished by connecting electronic and mechanical components to a substrate or a package of the size and shape of the DIP switches housing with provisions for soldering and attaching the assembly to a system circuit board.

Thus the electronic components normally used with a DIP switch are integrated into a single package with the DIP switch.

DRAWING FIGURES

In the drawings, closely related figures have the same number but different alphabetic suffixes.

REFERENCE NUMERALS

10A—SPST DIP Switch
10B—Rotary DIP Switch
10C—Vertical Single Row DIP switch
10D—SPST Rocker Action DIP switch
10E—Right Angle SPST DIP Switch
10F—MTMP DIP Switch
11—Rocker or slide action switch lever
12—Package housing
13—Thin metal leads
14—Electronic buffer devices
15—Composite integrated circuit
18—Electronic decode device
22—Pull up or pull down resistors
23—Decoupling capacitor
25—Substrate of silicon or other similar material.
26—Printed circuit board, substrate or chip carrier
27—Interconnecting electrical traces
28—Electrical contact pads (topside of PCB)
28B—Electrical contact pads (underside of PCB)
29—Enable line to buffer
30—DIP socket pins or mounting leads
31—Chip carrier
34—System circuit board
35—Other devices on an electronic system circuit board
38—Rotating switch contact
39—Computer

DESCRIPTON OF FIG. 1

As previously noted, in any electronic system it is highly desirable to reduce circuit board space and the number of components. Current electronic systems which use prior-art DIP switches must include additional components on the system circuit board to interface to the DIP switch, as well as to read and/or interpret its setting.

Figure 1:
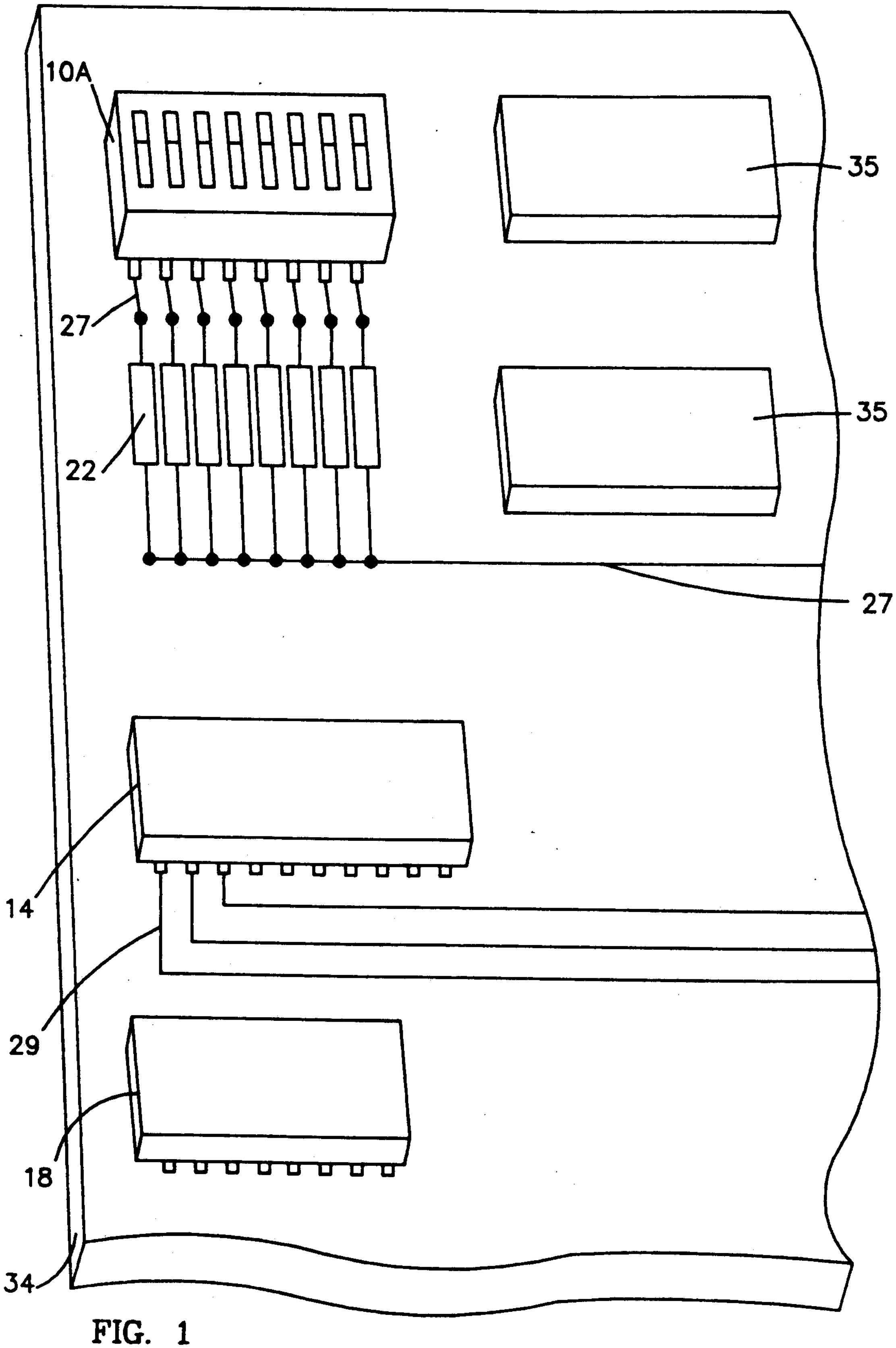
FIG. 1 PRIOR ART
FIG. 1 shows a perspective view of a prior-art DIP switch and its associated, external components.

FIG. 1 is a perspective view of a prior-art arrangement comprising a DIP switch 10A installed on a electronic printed circuit board (PCB) 34. PCB 34 is usually a thin (1.65 mm thick) fiberglass or epoxy board with an etched copper surface. Switch 10A is attached and soldered to PCB 34, as are a number of additional components and devices that are needed to interface the DIP switch to an electronic circuit.

These additional components and devices include pull-up or pull-down resistors 22, a tri-statable electronic buffer device 14, and an electronic decode device 18.

Pull-up/down resistors 22 are used to provide a bias voltage to the switch contacts in switch 10A. These contacts would have no voltage value if the switch contacts were open. The pull-up/down resistor serves to stabilize the switch contact voltages so that the input to an electronic circuit will be a stable voltage. These resistors are connected electrically to the switch contacts (not shown) via electrical traces 27 on PCB 34.

Tri-state interface buffer 14 has three different output states.

A special enable line 29 (also shown FIG. 6A) goes to buffer 14. When enable line 29 is "inactive", the output level of the buffer will float at some neutral voltage level which will not produce any kind of result at any of the devices connected to this output. When line 29 is "active", buffer 14 will output either a high or a low voltage level to match whatever voltage level is on its input side (also see FIG. 5A). Therefore, the three states are floating, high, and low. Tri-state interface buffers are very useful in circuits where a device can talk-to (or is interconnected) with many other devices via a single interconnect path. Buffer device 14 is connected electrically to switch 10A via electrical traces (not shown, but similar to traces 27).

Decode logic device 18 will take different actions based on the voltage levels of the input signals provided to it. Logic device 18 decodes the combination of these signals like an electronic lock and then may "open the lock" (provide the proper voltage output level) when given the right combination. This output voltage can be used to enable buffer device 14 via enable line 29, or it may be routed to the electronic system board via electrical traces (not shown, but similar to traces 27). Electrical traces are also used to connect input s and interconnections between decode logic device 18 and the other components.

Other devices on PCB 34, indicated generally at 35, may consist of integrated circuits, such as microprocessors, memory devices, or any other electronic components commonly used in the rest of the system.

As stated, these additional components (22, 14, and 18) must be connected to DIP switch 10A using extensive electrical interconnections, such as traces 27, and other circuit paths (not shown) on PCB 34 in order to use the DIP switch in an electronic circuit. This requirement puts an extra and unwanted burden on the circuit design engineer to include these additional parts on the schematic drawings and on the PCB layout. Additional manufacturing costs are also incurred as a direct result of using these extra components. These extra costs are due to the use of a larger PCB to accommodate these components and the time and labor expenses to install, test, and support them. Packaging costs can also be higher as a result of using a larger PCB.

DESCRIPTION OF FIGS. 2A THROUGH 2C

Figure 2A:
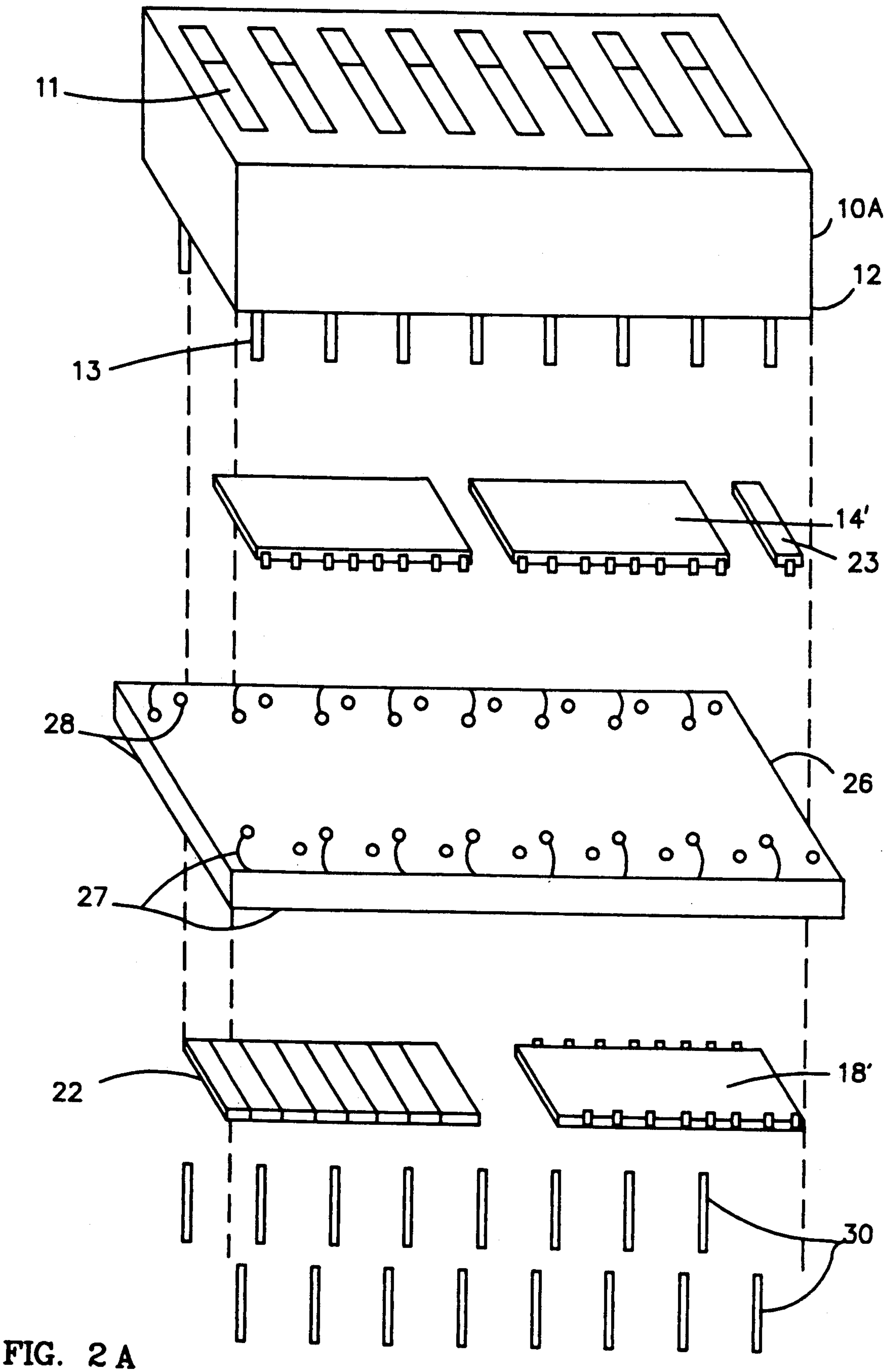
FIG. 2A shows an exploded general view of a DIP switch assembly according to my invention.
Figure 2B:
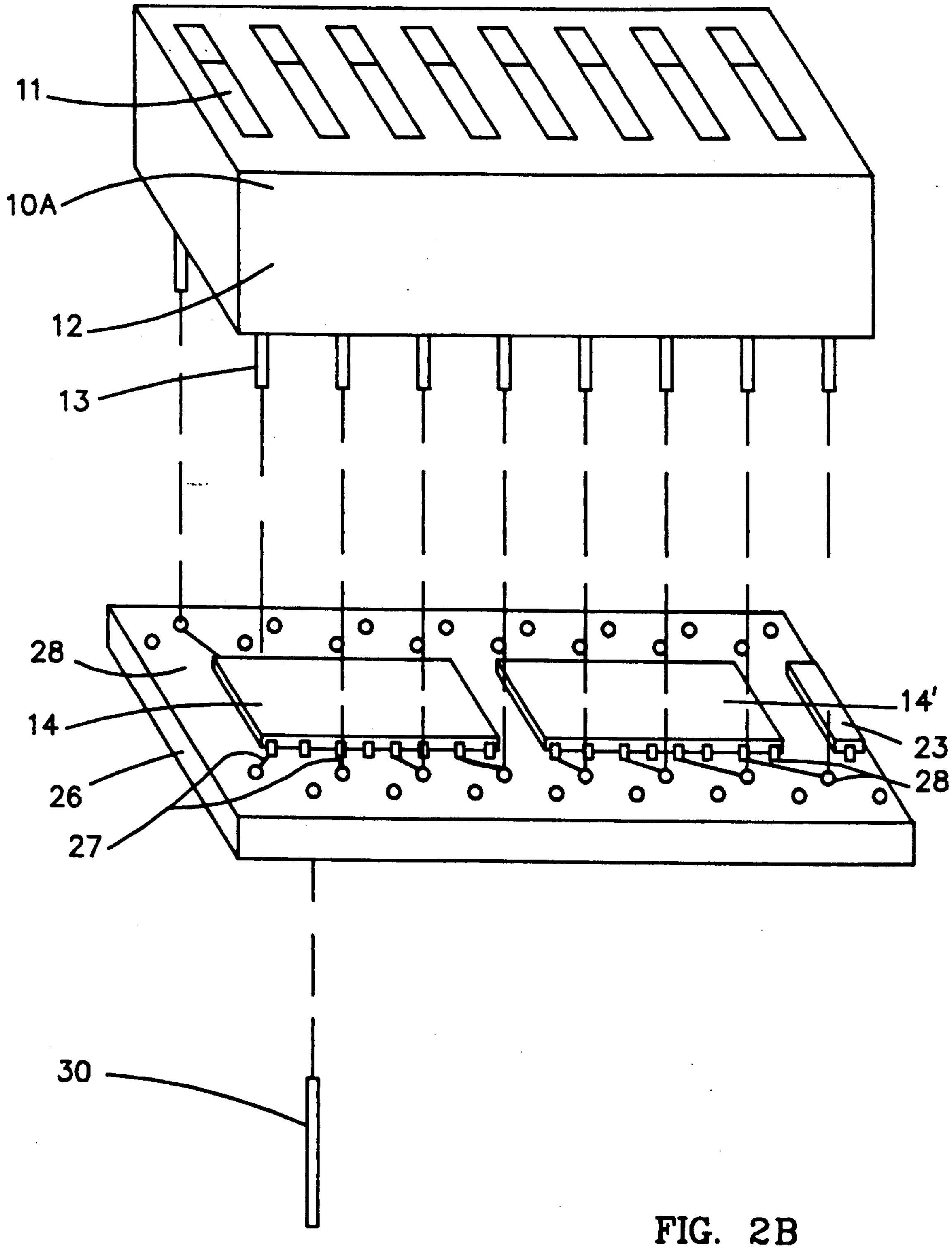
FIG. 2B shows a detailed top perspective view of the switch of FIG. 2A.
Figure 2C:
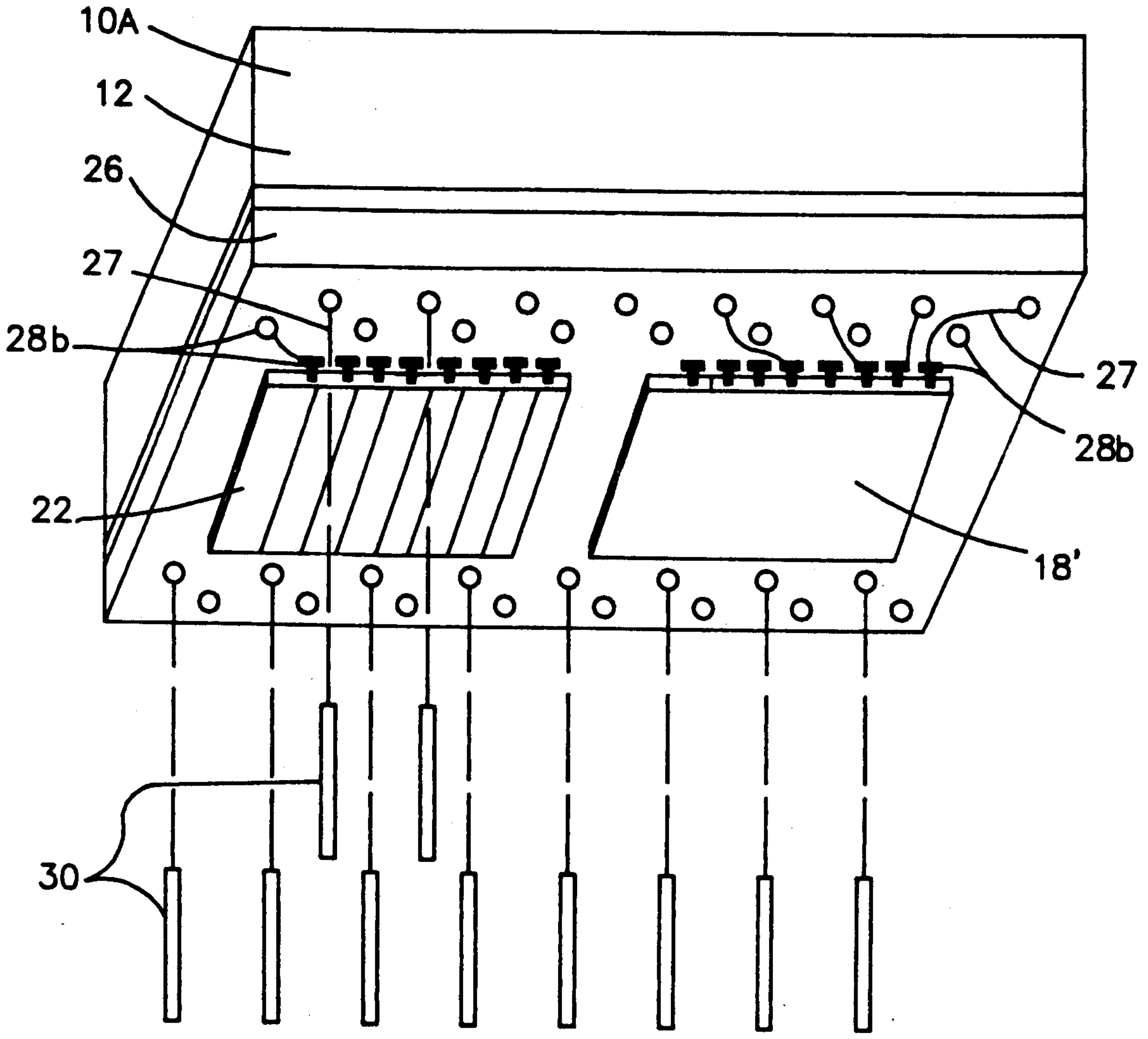
FIG. 2C shows a detailed bottom perspective view of the switch of FIG. 2A.

FIG. 2A is a general (non-detailed) exploded view of a DIP switch assembly according to a preferred embodiment of my invention. This assembly utilizes surface mount devices, i.e., electronic components designed to be attached and soldered to the surface of a printed circuit board by a plurality of metal leads extending from the sides of the device. FIGS. 2B and 2C show details of the assembly of FIG. 2A, looking from top and bottom perspectives, respectively.

The assembly comprises a typical off-the-shelf, low-profile DIP switch 10A (FIG. 2A), surface mounted integrated circuits of a small outline package size consisting of an electronic buffer device 14', and electronic decode device 18', surface mounted pull-up or pull-down resistors 22', an optional decoupling capacitor 23, a printed circuit board (PCB) or substrate 26, and DIP socket pins or mounting leads 30, which provide a means for attaching the assembly to an PCB (not shown, but similar to PCB 34 of FIG. 1).

DIP switch 10A (FIG. 2B) has slide-action, manually-movable operating levers 11 (alternatively rocker-action levers can be used). Switch 10A also has metal leads 13, which are to be inserted and soldered to electrical pads 28 on PCB 26. Metal leads 13 can optionally be of a surface-mount type, rather than the through-hole type shown. DIP switch 10A is soldered and attached to PCB 26 which also has other electronic components mounted to it as described below. DIP switch 10A mounts on the top side of PCB 26. Other components are also mounted to both the top and bottom sides of PCB 26. Those mounted to the top side of PCB 26 are mounted under switch 10A. This provides an assembly of several components sandwiched together on a single PCB which has an area smaller than the sum of the areas of the individual components which are attached to it. Electrical traces 27 on PCB 26 provide electrical interconnections between DIP switch 10A and the other components.

Electronic buffer device 14' is an active electronic device which interfaces the DIP switch to the electronic circuitry of the system which reads the DIP switches' setting and performs some function as a result of that setting. As embodied, this buffer device will be a "small outline" package which includes a CMOS (complementary metal oxide silicon) or a TTL (transistor-to transistor logic) type integrated circuit. The package size of this buffer device is equal to or smaller than the outline package size of DIP switch 10A. Buffer device 14' is attached and soldered to electrical pads 28 on the top of PCB 26. These pads provide a bonding between device 14' and 26, as well as a means for electrically interconnecting device 14' to traces 27 (FIG. 2A). Traces 27 electrically interconnect the circuits of all the other components soldered, bonded, or attached to PCB 26 and are shown only generally in FIGS. 2A, 2B and 2C. The active configuration of traces 27 has been omitted for simplification, but is made according to well-known techniques to provide the circuit of FIG. 6A or 6B.

Decode logic device 18' (FIG. 2C) provides logic decoding for enabling interfacing buffers 14', or for providing an output to the electronic circuitry of the system which uses the DIP switch assembly. Device 18 is packaged similarly to buffer 14'. It should be noted that the decode logic device and other similar circuits may be offered as an option for a lower cost standard product. Device 18' is attached and soldered to electrical pads 28B on the underside of PCB 26.

Pads 28 and 28B are small, round, square, or rectangular areas of circuit trace etched on to the PCB in the same manner as electrical traces 27. These pads provide a surface for solder bonding devices 10A, 14', 18', 22, and 23 to PCB 26. These pads also electrically connect these devices to interconnecting traces 27.

Pull-up resistors 22' provide voltage bias to pull up or down the outputs from the internal contacts of switch 10A. These pull-up resistors are surface mount types attached to the underside of PCB 26 by way of solder bonding to electrical contact pads 28B.

The above described buffering device, decode logic device, and pull-up resistors may be combined into a single, custom integrated circuit using existing manufacturing processes.

Decoupling capacitor 23 is mounted to PCB 26 in a manner similar to pull-up resistors 22'. This decoupling capacitor is provided to reduce electrical noise of voltages at the switch assembly.

The DIP socket mounting pins or surface mount leads 30 are used to insert or attach, connect, and solder the integrated electronic DIP switch assembly to the circuit board (not shown) of the system using this assembly. Mounting pins 30 are small, thin pins made of metal. They are attached to electrical pads 28B on the underside of PCB 26 and are electrically interconnected to other components on PCB 26 by way of electrical traces 27. Pins 30 provide a means for mounting and electrically connecting the DIP switch assembly into an user's circuit board (not shown). Pins 30 are shown as through-hole types, but can optionally be surface-mounted types.

As stated, substrate or PCB 26 is the medium to which all the described components of this embodiment are attached and interconnected. It can be made of any industry standard material, such as an etched, copper-covered fiberglass, or epoxy board. Components will be bonded or surface mounted to this substrate with electrical interconnections made between the components.

These electrical interconnections will be etched into the copper plating of the substrate or silk screened onto the substrate using conventional electronic circuit board manufacturing processes.

Components 10A, 14', 18', 22', 23, and 26 have a physical size and shape which is of a certain area in size. Components 10A, 14, 18, 22, and 23 have a certain number of thin metal leads extending from their sides or bottom which provide for attachment of the device to electrical pads 28 on PCB 26.

DESCRIPTION OF FIG. 2D

Figure 2D:
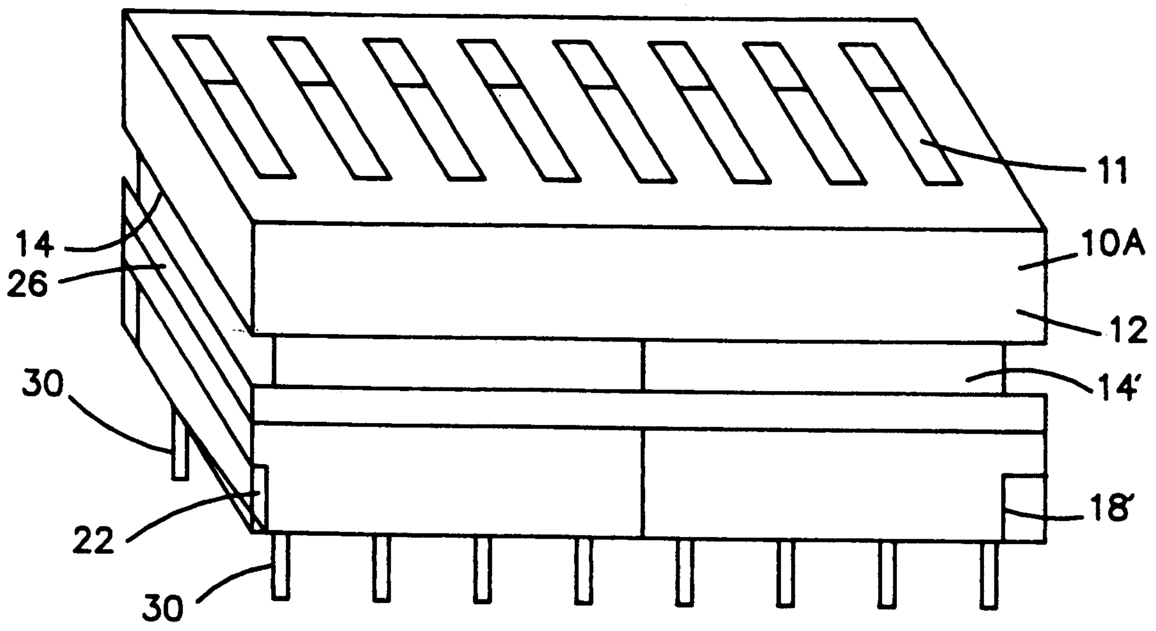
FIG. 2D shows an assembled view of the switch assembly of FIG. 2A.

FIG. 2D shows the DIP switch assembly of FIG. 2A assembled and ready for use in an electronic circuit. The components described above are connected together on PCB or substrate 26 during manufacturing. The components are soldered to electrical pads 28 and 28B on the PCB. Soldering the devices to the pads not only serves to electrically connect them to interconnecting traces 27, but to also hold them together mechanically due to the bonding affect of the solder. This assembly is then encapsulated in epoxy or other such material (not shown) to provide improved environmental protection, aesthetic appearance, and ease of installation. The connection and bonding of all the components of the assembly will result in a package outline dimension (when looking down on the top) that will not be greater than the dimension of the DIP switch.

DESCRIPTION OF FIG. 3A

Figure 3A:
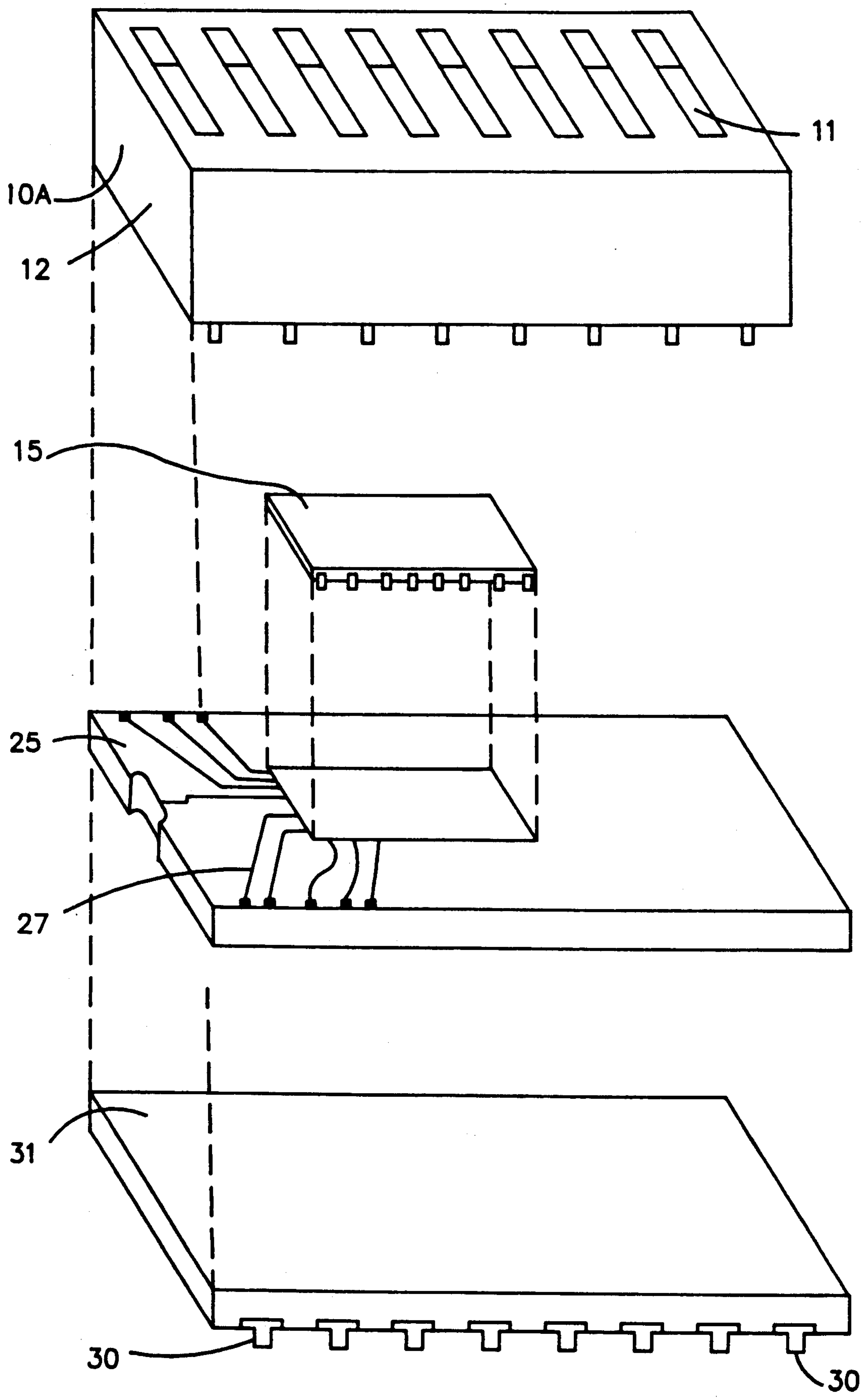
FIG. 3A shows an exploded view of a DIP switch assembly using a "chip-on-board" manufacturing process.

FIG. 3A shows an exploded view of another embodiment of the present invention using a "chip-on-board" manufacturing processes. In the "chip-on-board" process, a composite integrated circuit 15, which contains some or all of the devices described previously (bias resistors, buffering devices, and decode logic circuitry) is bonded and soldered to a substrate 25, which is made of silicon or other suitable material. Alternatively, the described devices will be built directly onto the substrate using conventional integrated circuit manufacturing processes which involve several procedures to photo-expose an electronic circuit onto the substrate. Dip switch 10A mounts on top of and over integrated circuit 15 by way of metal leads 13 which are inserted into holes in substrate 25. The above-described components are mounted to a plastic or ceramic chip carrier 31 by conventional bonding techniques used with "chip-on-board" technology. The chip carrier also normally has metal mounting leads 30, by which the assembly is mounted to a printed circuit board (not shown). Electrical traces 27 connect the components electrically to one another.

DESCRIPTION OF FIG. 4A

Figure 4A:
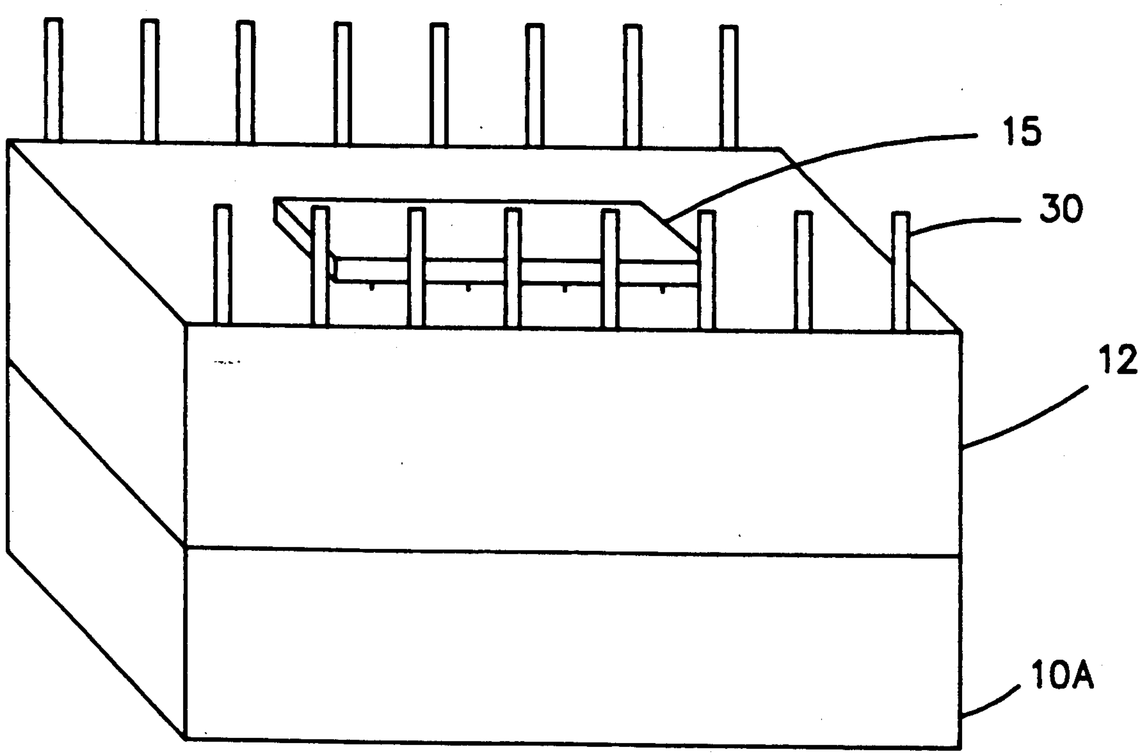
FIG. 4A shows a perspective view of the DIP switch assembly as embodied with components mounted to the switches' housing.

FIG. 4A illustrates another embodiment of the present invention with components mounted within the switch assembly housing. This DIP switch assembly uses a custom integrated circuit 15, similar to that of FIG. 3A. This integrated circuit is installed and bonded to DIP switch 10A within its normal plastic or epoxy type housing 12. This differs from the switch assembly of FIG. 3A in that the integrated circuit is installed in the DIP switches' assembly housing, rather than having the DIP package housing attaching to the "chip-on-board" carrier Integrated circuit 15 is electrically connected to the switch contacts of switch 10A via conventional "wire-bonding" processes which are commonly used for the manufacturing of hybrid electronic integrated circuits. Dip socket mounting pins 30 are embedded in the plastic of housing 12 and protrude from the underside of the DIP switch assembly. They are interconnected to integrated circuit 15 via "wire-bonding" processes. All bonding and interconnecting of components are within the dimensions of housing 12.

DESCRIPTION OF FIGS. 5A TO 5E

FIGS. 5A to 5E show different types of DIP switch assemblies using the basic concepts, processes, and spirit of the invention. These examples are provided to show a representation of the types of DIP switch assemblies which will use the features of this invention.

Figure 5A:
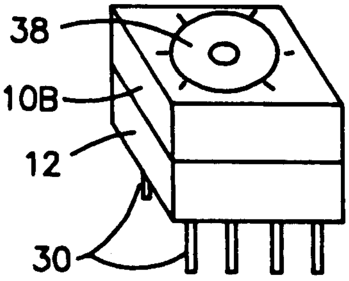
FIGS. 5A through 5E show several different types of DIP switch assemblies using the processes of the above figures.

FIG. 5A shows a rotary encoded DIP switch assembly. A rotary encoded DIP switch 10B can select various number codes in either decimal, binary, or hexadecimal output codes as previously described. As rotary contact mechanism 38 is set to different positions, a unique output code results at mounting leads 30. The switch assembly has built-in active electronic components to allow it to be easily read by an electronic circuit, or for comparing address type logic codes, as described previously.

Figure 5B:
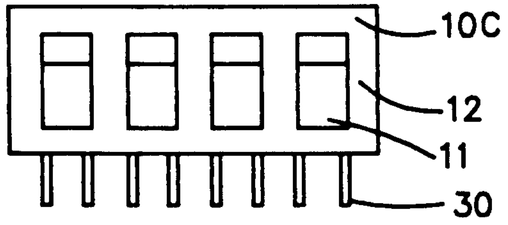

FIG. 5B shows a vertical, single-row DIP switch assembly Switch 10C is a SPST-type with four individual switches and operating levers 11. Connection to a system electronic circuit board is made through mounting leads 30. The DIP switch assembly has active components built into it, as previously described.

Figure 5C:
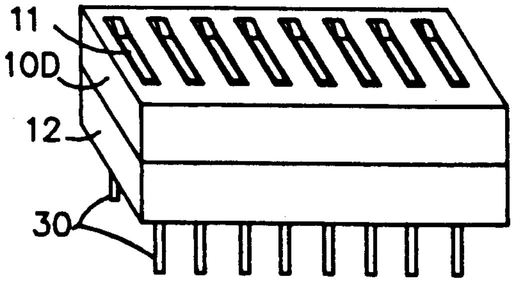

FIG. 5C shows a rocker-type, eight-position SPST DIP assembly employing switch 10D. The switch actuating mechanisms employ levers 11 which are pressed to pivot each individual switch to the on or off position, much like a teeter-totter. This DIP . switch assembly contains active components as described previously and connected to a circuit board (not shown) by mounting leads 30.

Figure 5D:
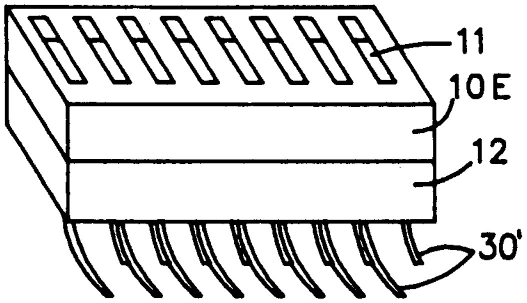

FIG. 5D shows a right-angle, eight-position, SPST DIP switch 10E in a similar assembly. This assembly is designed to be mounted in a right-angle configuration with its metal leads 30' extending out from package 12, and then bent at a 90-degree angle. This assembly contains active components as described previously.

Figure 5E:
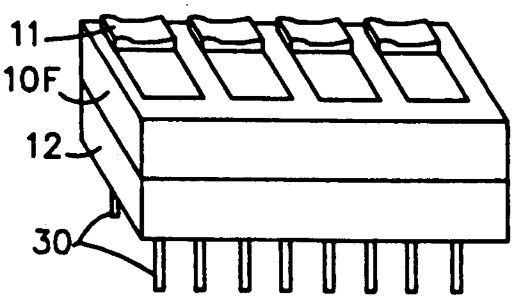

FIG. 5E shows a multi-throw, multi-pole DIP switch 10F in another similar assembly. This type of switch assembly will make two or more connections with the actuation of a single lever 11. Connections to a system circuit board are by mounting leads 30. This assembly also contains active components as described previously.

DESCRIPTION OF FIGS. 6A AND 6B

Figure 6A:
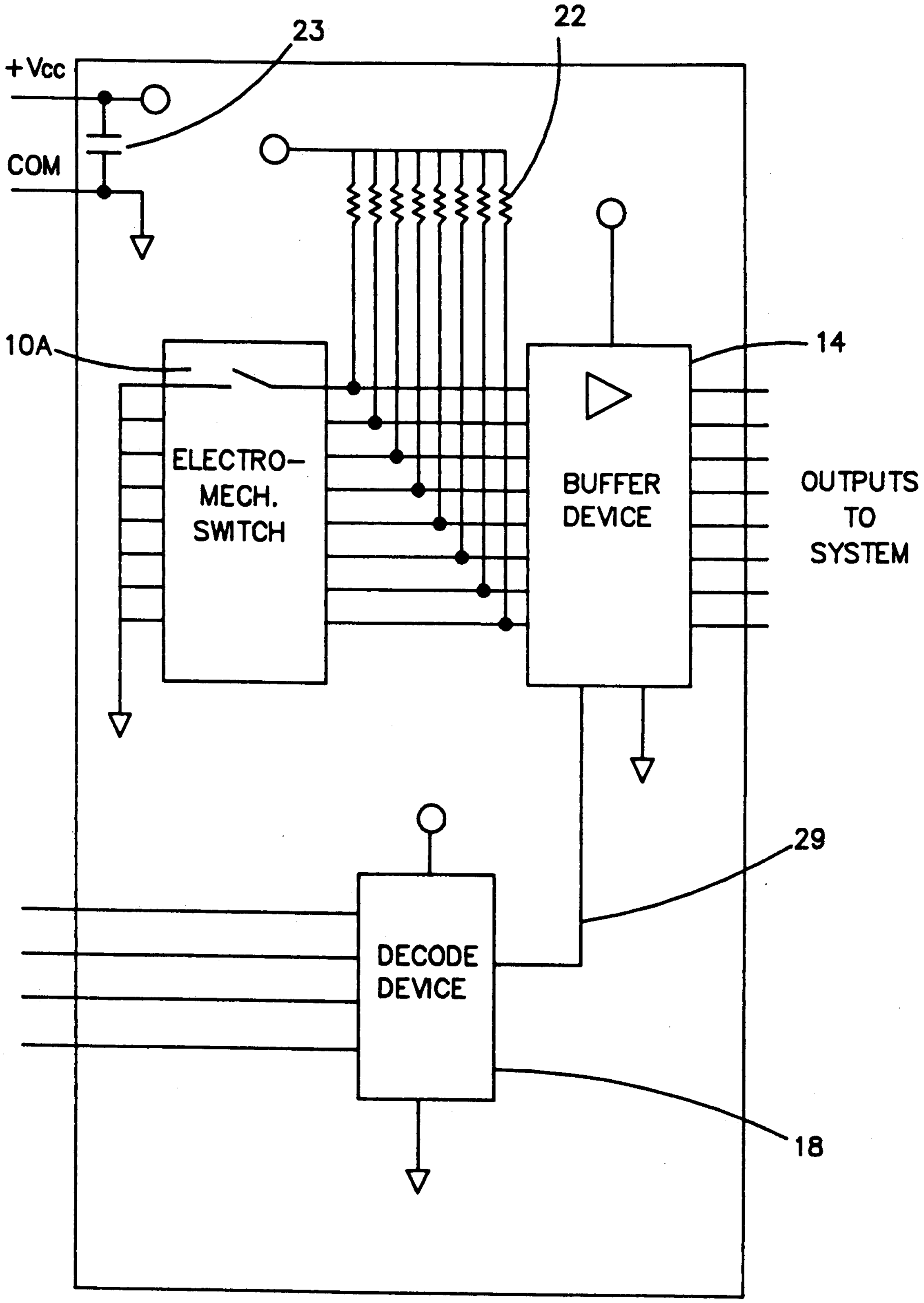
FIGS. 6A and 6B show electrical diagrams of typical electronic circuits embodied in the switch assemblies of the invention.
Figure 6B:
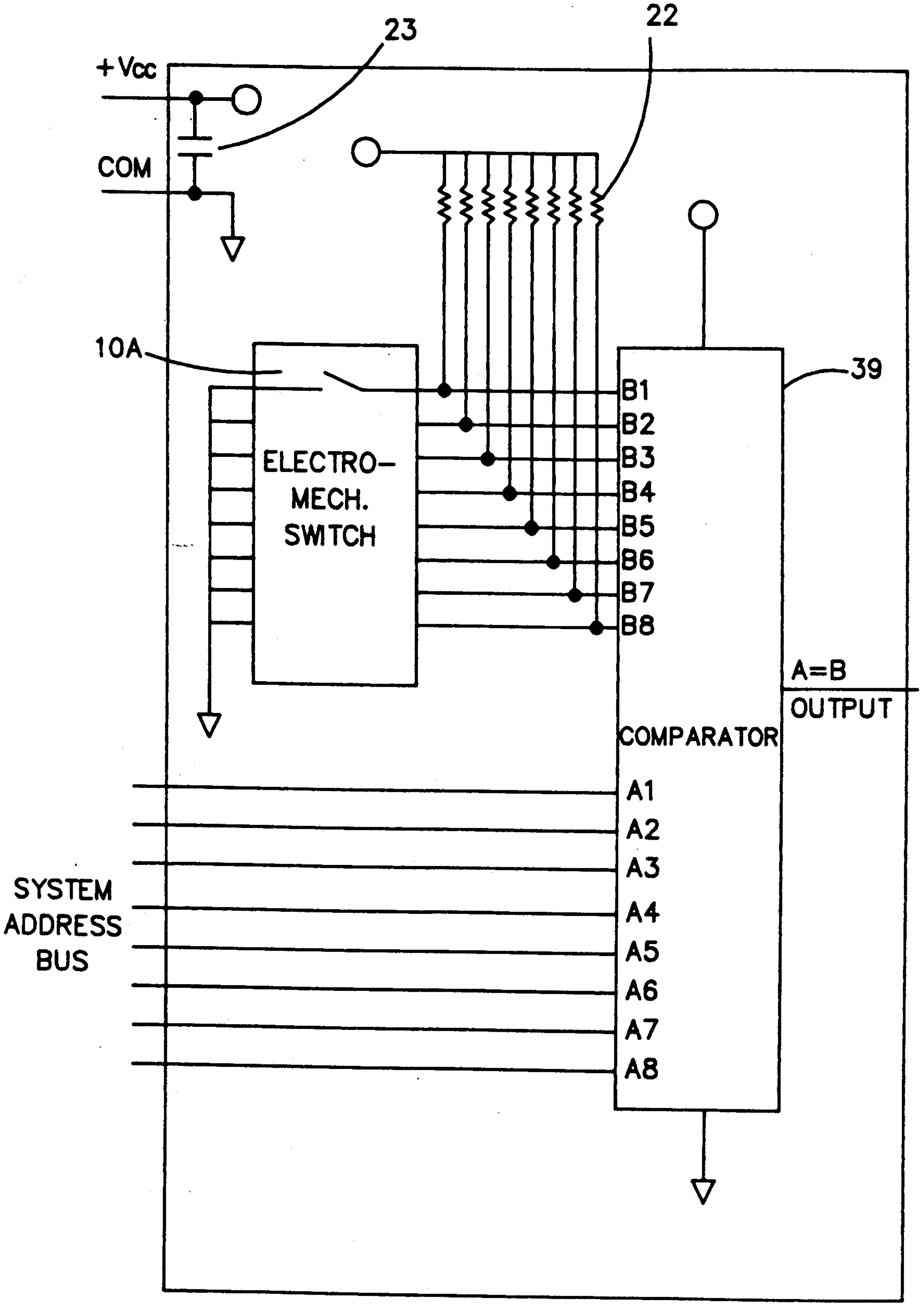

FIGS. 6A and 6B are schematic diagrams illustrating the internal components, connections, and function of typical circuits used in the integrated electronic DIP switch assembly.

FIG. 6A is a circuit which will buffer and interface the DIP switch assembly to a microprocessor. DIP switch 10A, located on the left side of the schematic, has all leads on its input side connected to ground. In the upper part of the schematic, a bias voltage +Vcc is decoupled (connected to ground or the common ["COM"]) line by a capacitor 23. Also a set of pull-up or pull-down resistors 22 are connected to each of the output lines, respectively, of switch 10A. With one of the individual switches off, the connection between a pair of switch leads is severed, causing the output side of the pair of leads to be pulled to the voltage level of the pull-up or pull-down resistors. With one of the individual switches on, the connection between the pair of switch leads conducts, so that the voltage level on the output side of the DIP switch is equal to ground (or some other predetermined voltage).

The individual voltage level of each output line of switch 10A is routed to a corresponding input of tri-statable interface buffer 14. When decode logic circuit 18 in the lower part of the schematic determines that the signal pattern on its input side is correct, its single output will produce the proper voltage level to enable buffer 14. With this enable signal present, buffer 14 will conduct each of the appropriate voltage levels present on its input side to its output side. Without the enable present, all of the buffer outputs are at the floating voltage level, as described previously.

FIG. 6B shows a circuit used to decode and recognize a selectable address. With DIP switch 10A on the upper left set to a certain pattern of ONs and OFFs, a comparator 39 will compare the voltage on its input lines B1 through B8 as affected by resistors 22, and the setting of the individual switches to a pattern of high and low voltages sent to its other set of comparing input lines, A1 through A8. When the A1 through A8 inputs match the B1 through B8 inputs exactly, comparator 18 will output a voltage level indicating the match; otherwise it will output a level indicating no match.

SUMMARY, RAMIFICATIONS AND SCOPE

As stated above, the Integrated Electronic Dip Switch will incorporate into a single package all of the components needed to interface the DIP switch to an electronic circuit. In addition the described Integrated Electronic DIP switch will have a package housing of approximately the same size and shape as existing DIP switches. Furthermore these features provide the advantages of requiring no additional external components to interface, read, or interpret the DIP switch setting;

reduce the time necessary to design, assemble, and test a product using a DIP switch due to a reduction of components and complexity;

reduce the required size of an electronic system PCB due to a reduced number of components and interconnections; and reduce the product packaging size and overall costs as a result of the reduced number of components and PCB size.

Although the description above contains many specificities, these should not be construed as limiting the scope of the invention, but as merely providing illustrations of some of the presently preferred embodiments of this invention. For example the DIP switch may be of a different style or shape, or may incorporate additional features to provide other options which affect performance or appearance.

Thus the scope of the invention should be determined by the appended claims and their legal equivalents, rather than by the examples given.

I claim:

1. An integrated switch and circuit assembly comprising:

a dual-inline package comprising an elongated body having a top rectangular surface, a bottom rectangular surface opposite to said top rectangular surface, of the same size as said top rectangular surface, and having a first plurality of metal leads having a given spacing and size and extending therefrom such that said leads can be attached to a mounting device and provide electrical and mechanical connections for said package, said dual-inline package containing a plurality of switches, said switches each having a manually operable switch-actuating member on said top surface and a plurality of switch contacts within said package, an electrical circuit comprising a plurality of interconnected electronic components, said components including a plurality of transistors arranged to provide an active electronic circuit for interfacing said switches with an electronic system, said electrical circuit being mechanically mounted in said package between said top and bottom rectangular surfaces of said package, and means for electrically interconnecting said electrical circuit between said switch contacts and said first plurality of metal leads, said means for interconnecting comprising (a) a corresponding second plurality of metal leads having the same spacing between adjacent leads as said first plurality of leads, and (b) means for connecting said electronic components to both of said pluralities of leads, said electrical circuit and said means for interconnecting being confined within the dimensions of said bottom and top rectangular surfaces of said dual-inline package when seen from a direction facing and orthogonal to said top rectangular surface.

2. The assembly of claim 1 wherein said interconnected electronic components of said electrical circuit also comprise an integrated circuit and a plurality of resistors.

3. The assembly of claim 2 wherein said integrated circuit comprises a flat package.

4. The assembly of claim 1 wherein said electrical circuit and said means for interconnecting are arranged in a stack below said plurality of switches.

5. The assembly of claim 1 wherein said switches are rocker switches.

6. The assembly of claim 1 wherein said switches are slide-action switches.

7. An integrated switch and circuit assembly, comprising:

a dual-inline-package comprising an elongated body having a top rectangular surface, a plurality of individual, manually operable switches in said package with a corresponding plurality of manually operable switch-actuating members on said top surface, a bottom rectangular surface opposite to said top surface, of the same size as said top surface, and having a first plurality of metal leads having a given spacing and size and extending therefrom such that said leads can be attached to a mounting device for providing electrical and mechanical connections to said switch package; and an electrical circuit comprising a plurality of interconnected electronic components, said components including a plurality of transistors arranged to provide an active electronic circuit which provides active logic decoding and active buffering of said switches with an electronic system, said electrical circuit being mechanically mounted in said package between said top and bottom rectangular surfaces of said package, and means for interconnecting said electrical circuit to said leads and to said switches, said electrical circuit and said means for interconnecting being confined within the dimensions of said bottom and top rectangular surfaces when seen from a direction facing and orthogonal to said top surface.

8. The assembly of claim 7 wherein said interconnected electronic components of said electrical circuit also comprise an integrated circuit and a plurality of resistors.

9. The assembly of claim 8 wherein said integrated circuit comprises a flat package.

10. The assembly of claim 7 wherein said interconnected electronic components are arranged in a stack below said plurality of switches.

11. The assembly of claim 7 wherein said switches are rocker switches.

12. The assembly of claim 7 wherein said switches are slide action switches.

13. An integrally packaged switch and circuit assembly comprising:

a plurality of switches in a switch package having a first plurality of leads extending therefrom, said switch package having a first area when seen from a given top direction;

at least one electronic circuit having a second plurality of leads extending therefrom, said electronic circuit having a second area, said electrical circuit comprising a plurality of interconnected electronic components, said components including a plurality of transistors arranged to provide an active electronic circuit for interfacing said switches with an electronic system; and an electrical interconnect board receiving and mounting both said switch package and said electronic circuit so that (I) said switch package and said electronic circuit spatially overlay each other in their mounted position while (II) said interconnect board functionally electrically interconnects said switch package assembly to said electronic circuit, said electrical interconnect board having a third plurality of leads, less in number than the sum of the said first and said second plurality;

said electrical interconnect board being electrically and mechanically mountable in a third area on a motherboard which is less than said combined first and second areas, said plurality of switches, said electronic circuit and said interconnect board all are joined into a single integrally package assembly which is mountable onto the motherboard.

14. The integrally packaged switch and circuit assembly according to claim 13 wherein said plurality of switches comprises a dual-in-line package switch.

15. The integrally packaged switch and circuit assembly according to claim 13 wherein said plurality of transistors comprises a buffer circuit.

16. The integrally packaged switch and circuit assembly according to claim 15 wherein said electronic circuit further comprises a plurality of pull-up resistors.

17. The integrally packaged switch and circuit assembly according to claim 16 wherein said electronic circuit further comprises a decode circuit.

18. A integrally packaged switch and circuit assembly according to claim 13, further comprising;

at least one other electronic circuit having a fourth plurality of leads extending therefrom, said other electronic circuit having a fourth area;

said electrical interconnect board receiving and mounting said other electronic circuit on its side opposite to said switch assembly package and said at least one electronic circuit, while functionally electrically interconnecting both electronic circuits and said switch package, said third area of said interconnect board being less than the combined first and fourth areas as well as said combined first and second areas.

* * * * *